(12) United States Patent
Chin

(10) Patent No.: US 6,639,356 B2
(45) Date of Patent: Oct. 28, 2003

(54) HEAT DISSIPATING LIGHT EMITTING DIODE

(75) Inventor: Yuan-Cheng Chin, Hsintien (TW)

(73) Assignee: Unity Opto Technology Co., Ltd., San Chung (TW)

( * ) Notice: Subject to any disclaimer, the term of this patent is extended or adjusted under 35 U.S.C. 154(b) by 21 days.

(21) Appl. No.: 10/107,403

(22) Filed: Mar. 28, 2002

(65) Prior Publication Data
US 2003/0184220 A1 Oct. 2, 2003

(51) Int. Cl.⁷ .................................................. H01J 1/62
(52) U.S. Cl. ........................................ 313/499; 313/498
(58) Field of Search ................................ 373/498, 499, 373/506, 512; 257/99, 675, 676, 98, 100

(56) References Cited

U.S. PATENT DOCUMENTS 6,476,549 B2 * 11/2002 Yu .............................. 313/499

* cited by examiner

Primary Examiner—Vip Patel
(74) Attorney, Agent, or Firm—Bacon & Thomas, PLLC

(57) ABSTRACT

A light emitting diode has a base made of electrically conductive material and having a receiving recess defined in a top of the base and at least one step formed on a peripheral edge thereof, a lighting chip received in the receiving recess of the base, a heat dissipating element made of electrical insulation material and having at least two supports extending out of the heat dissipating element to electrically connect to the lighting chip. The heat dissipating element is mounted on top of the base and is so configured to mate with the at least one step of the base. A translucent cover is mounted on top of the heat dissipating element.

10 Claims, 4 Drawing Sheets

HEAT DISSIPATING LIGHT EMITTING DIODE

BACKGROUND OF THE INVENTION

1. Field of the Invention

The present invention relates to a light emitting diode, and more particularly to a light emitting diode with heat dissipating capability. The light emitting diode has a first mounting seat with a light emitting chip mounted thereon and a second mounting seat securely engaged with the first mounting seat so as to enclose with the first mounting seat the light emitting chip between the first and the second mounting seats. Due to the first mounting seat being made of an electrically conductive material, heat generated by the light emitting chip is able to be dissipated by the first mounting seat to avoid malfunction caused by overheat.

2. Description of Related Art

There are many different light emitting diodes (LED) available on the market, which are able to emit visible, invisible, infrared light beans and even laser bean respectively. A conventional LED 9 is shown in FIG. 4, which comprises a first and a second conductive brackets 91, 91A. The first conductive bracket 91 has a reflection recess 911 defined in a top of the first conductive bracket 91 and having a lighting chip 93 securely mounted in the reflection recess 911 with a conductive glue 92. Each of the first and second conductive brackets 91, 91A has a wire 94 electrically connected to the lighting chip 93. A translucent cover 95 is mounted to enclose therein the first and second conductive brackets 91, 91A, the lighting chip 93 and the wires 94. The cover 95 may be formed as an optical lens so as that the user is able to magnify or adjust the light beam of the lighting chip 93. This kind of LED structure does provide efficiency to the user about emitting sufficient light to meet the needs. Related arts are also disclosed in the U.S. Pat. No. 6,204,523B1 and U.S. Pat. No. 6,274,924B1 both issued to Carney et al in the year of 2001. Both patents disclose LED mounting techniques and teach or imply any method or structure to dissipate heat of the LED during light emission. Heat generated by LED becomes the largest drawback in LED manufacturing industry, which causes different malfunctions to the circuitry.

To overcome the shortcomings, the present invention intends to provide an improved LED structure to mitigate and obviate the aforementioned problems.

SUMMARY OF THE INVENTION

The primary objective of the invention is to provide an improved LED structure to effectively dissipate heat of the LED to reduce malfunction caused by heat.

In order to accomplish the objective, the LED structure of the present invention has a base, a light chip mounted in the base, a heat dissipating element engaged with the base and a translucent cover enclosing the light chip inside the base. The base is made of a metal so that heat generated by the lighting chip is able to be dissipated by the base. Furthermore, the base has at least one step formed on the peripheral edge thereof so as to increase the area for dissipating heat.

Other objects, advantages and novel features of the invention will become more apparent from the following detailed description when taken in conjunction with the accompanying drawings.

DETAILED DESCRIPTION OF PREFERRED EMBODIMENT

Figure 1:
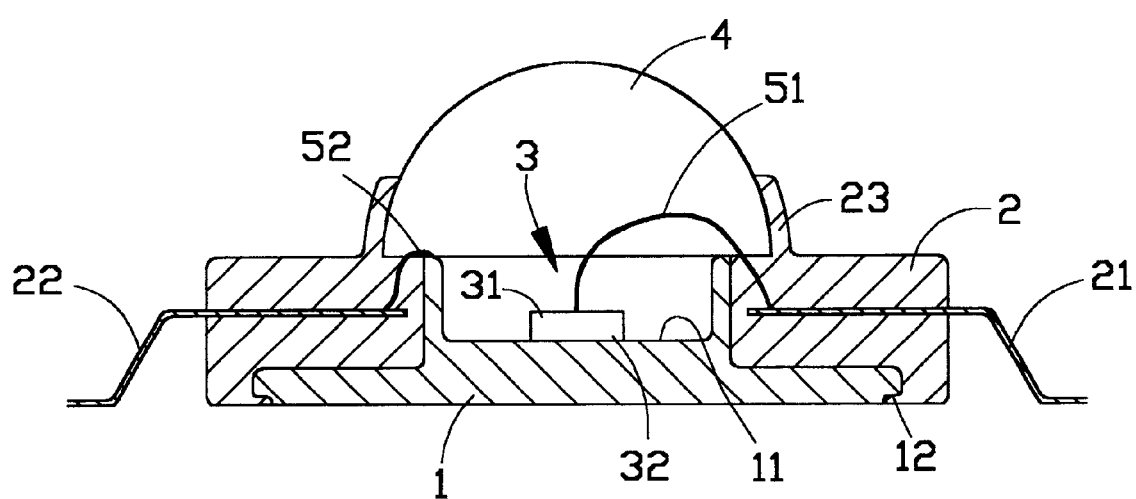
FIG. 1 is a schematic view showing the structure of the present invention.

With reference to FIG. 1, the light emitting diode (LED) constructed in accordance with the present invention has a base 1, a heat dissipating element 2, a light emitting chip 3 and a translucent cover 4.

The base 1 is electrically conductive so that the base 1 is able to be made from brass, aluminum or the like. The base 1 has a receiving recess 11 defined in a top of the base 1 for receiving therein the lighting chip 3 and at least one step 12 formed on a peripheral edge thereof.

The heat dissipating element 2 is made of electrical insulation material and is added with heat dissipating reinforcement element, such as $Al_2O_3$. The heat dissipating element 2 has at least two supports 21, 22 extending out of the heat dissipating element 2 and one of the supports 21, 22 is electrically connected to the lighting chip 3 by means of a first wire 51. The other support 22 is electrically connected to the base 1 by a second wire 52. The heat dissipating element 2 has an extension 23 extending upward from the heat dissipating element 2.

The translucent cover 4 is placed on top of the heat dissipating element 2 and is clamped by the extension 23 of the heat dissipating element 2. It is to be noted that the heat dissipating element 2 is made integrally and the step 12 of the base 1 is annularly formed outside the base 1. The bottom of the heat dissipating element 2 is so configured and sized to fit with the step 12 so that when the base 1 is connected to the heat dissipating element 2, the heat dissipating element 2 is able to mate with the base 1. The lighting chip 3 has different extrinsic semiconduction. The first wire 51 connects the top 31 of the lighting chip 3 to one of the support 21 which is electrically conductive. The second wire 52 connects the bottom 32 of the lighting chip 3 to the other support 22. Because the base 1 is made of a metal so that when the light chip 3 is lit and generating heat, the base 1 not only is a part of the conduction, but also a part of heat dissipation for dissipating heat from the lighting chip 3.

Figure 2:
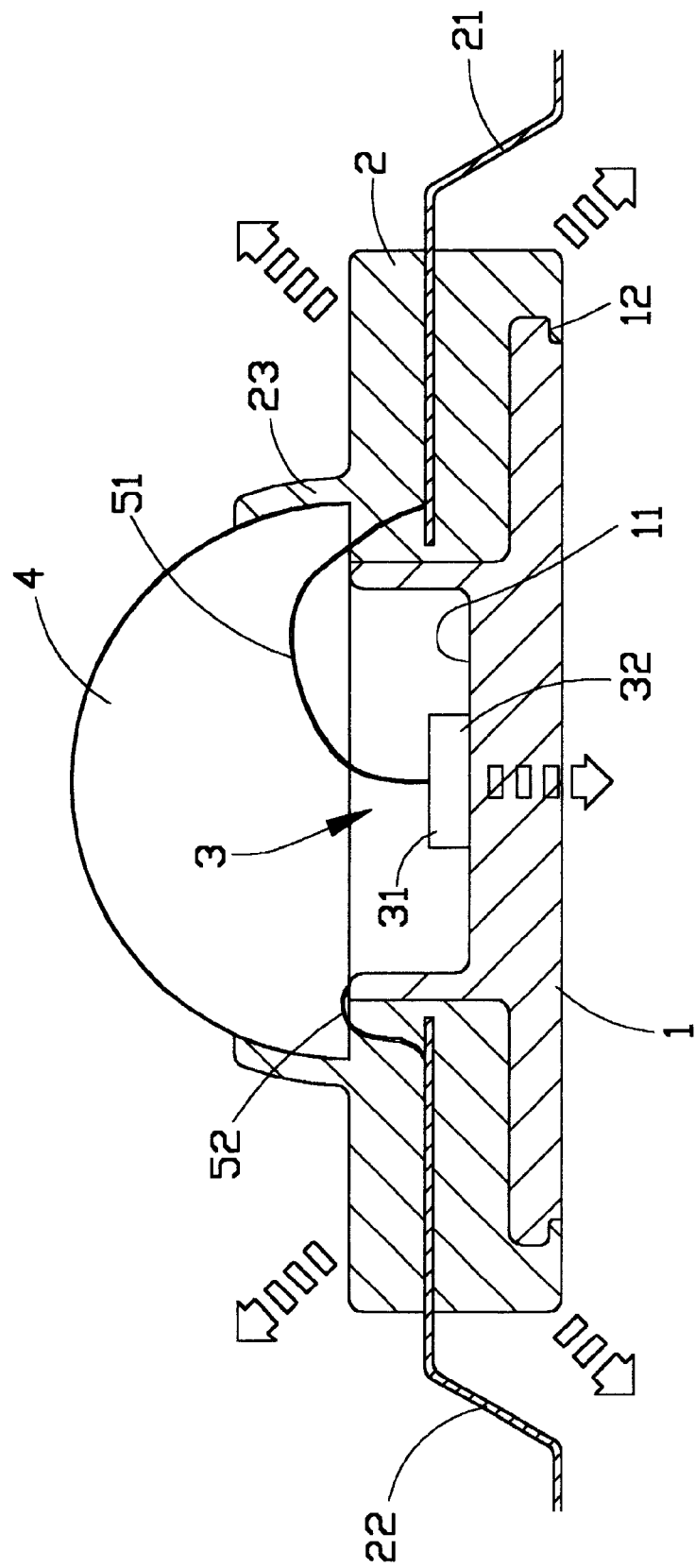
FIG. 2 is an operational view showing the heat being dissipated from the heat dissipating element of the present invention.
Figure 3:
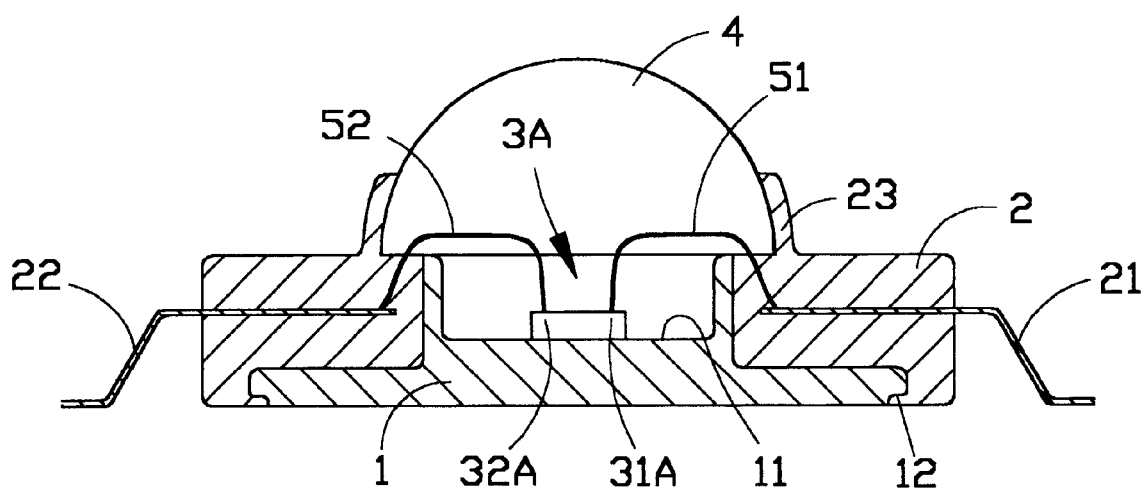
FIG. 3 is a schematic view showing the structure of the second preferred embodiment of the present invention.
Figure 4:
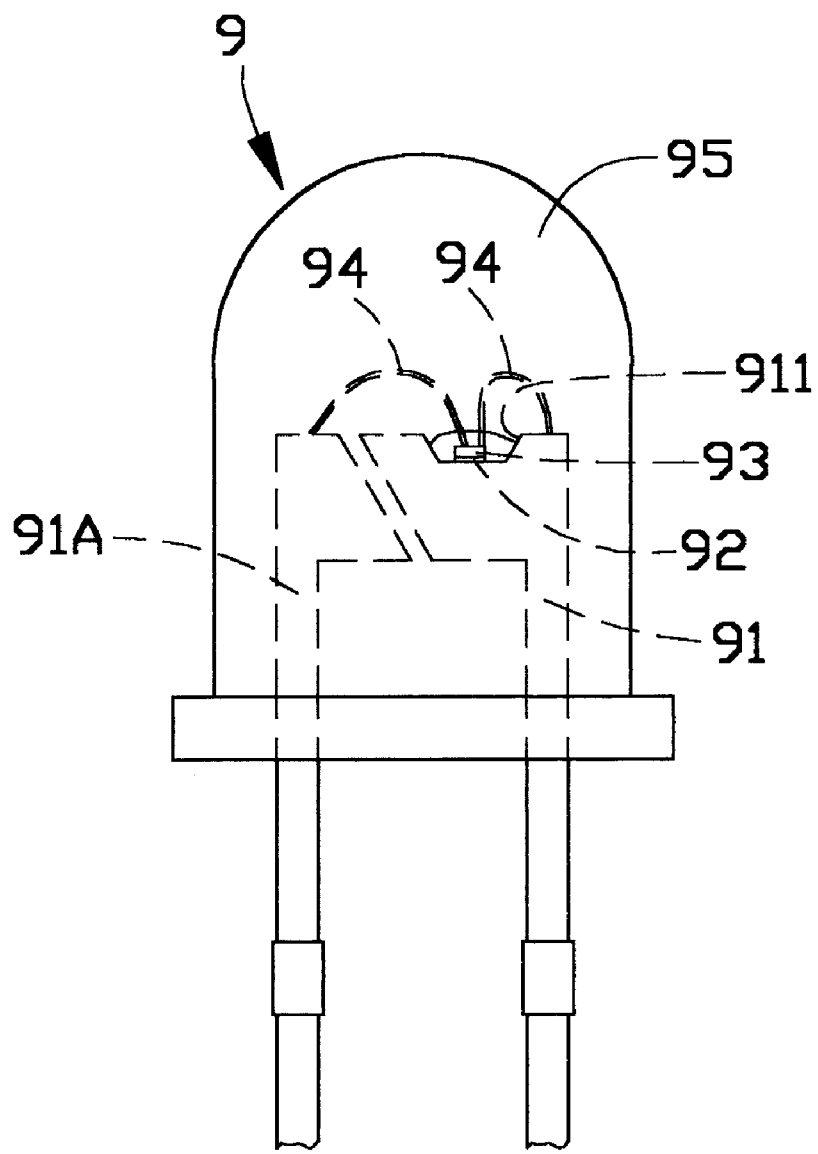
FIG. 4 is a schematic view showing the conventional LED structure.

With reference to FIG. 2, when the LED structure of the present invention is made, the connection between the base 1 and the heat dissipating element 2 can be accomplished by injection molding so that inaccurate combination between the base 1 and the heat dissipating element 2 caused by gluing is able to be minimized. Furthermore, not only the step 12 increases the area for heat dissipation, the step 12 can also increase the combination between the base 1 and the heat dissipating element 2. The heat dissipating reinforcement element ($Al_2O_3$) of the heat dissipating element 2 and the base 1 are able to dissipate heat in directions as shown by the arrow With reference to FIG. 3, the lighting chip 3A has two opposite sides 31A, 32A each with a different extrinsic semiconduction. The first wire 51 connects one side 31A to one of the supports (support 21) and the second wire 52 connects the other side 31B of the lighting chip 3A to the other support 22.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode comprising:
   a base made of electrically conductive material and having a receiving recess defined in a top of the base and at least one step formed on a peripheral edge thereof;
   a lighting chip received in the receiving recess of the base;
   a heat dissipating element made of electrical insulation material and having at least two supports extending out of the heat dissipating element to electrically connect to the lighting chip, wherein the heat dissipating element is mounted on top of the base and is so configured to mate with the at least one step of the base.

2. The light emitting diode as claimed in claim 1, wherein the at least one step is annularly formed on a peripheral edge of the base.

3. The light emitting diode as claimed in claim 1 further having a translucent cover mounted on top of the heat dissipating element.

4. The light emitting diode as claimed in claim 3, wherein the heat dissipating element has an extension extending upward from the heat dissipating element to securely engage with the translucent cover.

5. The light emitting diode as claimed in claim 1, wherein the lighting chip has a top and a bottom each with different extrinsic semiconduction with respect to one another, wherein a first wire electrically connects the top of the lighting chip to one of the supports and a second wire electrically connects the bottom of the lighting chip to the other support.

6. The light emitting diode as claimed in claim 1, wherein the lighting chip has a first side and a second side opposite to the first side, wherein a first wire electrically connects the first side of the lighting chip to one of the supports and a second wire electrically connects the second side of the lighting chip to the other support.

7. The light emitting diode as claimed in claim 1, wherein the heat dissipating element is provided with heat dissipating reinforcement element.

8. The light emitting diode as claimed in claim 1, wherein the heat dissipating element is made by injection molding.

9. The light emitting diode as claimed in claim 1, wherein the base is made by brass, aluminum or the combination thereof.

10. The light emitting diode as claimed in claim 7, wherein the heat dissipating reinforcement element is $Al_2O_3$.

* * * * *